US008735737B2

(12) United States Patent
Ihara et al.

(10) Patent No.: US 8,735,737 B2
(45) Date of Patent: May 27, 2014

(54) SUBSTRATE HAVING LEADS

(75) Inventors: Yoshihiro Ihara, Nagano (JP); Takehito Terasawa, Nagano (JP); Masakuni Kitajima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 253 days.

(21) Appl. No.: 12/782,861

(22) Filed: May 19, 2010

(65) Prior Publication Data
US 2010/0300742 A1 Dec. 2, 2010

(30) Foreign Application Priority Data

May 28, 2009 (JP) ................................. 2009-128785

(51) Int. Cl.
H05K 1/11 (2006.01)
H01R 12/57 (2011.01)
(52) U.S. Cl.
CPC ..................................... *H01R 12/57* (2013.01)
USPC .......................................... 174/261; 361/760
(58) Field of Classification Search
CPC ............... H01R 12/57; H01R 13/2435; H05K 2201/0311; H05K 2201/10378; H05K 2201/10719; H05K 2201/10946; H05K 3/325; H05K 3/3421
USPC .......... 174/351, 260–262; 361/760, 772, 778; 29/842, 844; 439/66, 886
See application file for complete search history.

(56) References Cited

U.S. PATENT DOCUMENTS

| | | | | |
|---|---|---|---|---|
| 5,974,662 A * | 11/1999 | Eldridge et al. | ................. | 29/842 |
| 6,029,344 A * | 2/2000 | Khandros et al. | ............... | 29/874 |
| 6,183,267 B1 * | 2/2001 | Marcus et al. | .................. | 439/66 |
| 6,965,245 B2 | 11/2005 | Kister et al. | | |
| 7,025,600 B2 * | 4/2006 | Higashi | ........................... | 439/66 |
| 7,057,295 B2 | 6/2006 | Ju | | |
| 7,264,486 B2 | 9/2007 | Ma | | |
| 7,547,850 B2 * | 6/2009 | Kirby et al. | .................... | 174/260 |
| 2005/0208834 A1 * | 9/2005 | Kodaira et al. | ............... | 439/630 |
| 2007/0087625 A1 * | 4/2007 | Ma | ................. | 439/570 |
| 2008/0090429 A1 * | 4/2008 | Mok et al. | ........................ | 439/81 |
| 2008/0239683 A1 * | 10/2008 | Brodsky et al. | ............... | 361/760 |
| 2009/0102041 A1 | 4/2009 | Ju | | |
| 2011/0003492 A1 * | 1/2011 | Ihara | .............................. | 439/81 |

FOREIGN PATENT DOCUMENTS

JP 11-154571 6/1999

OTHER PUBLICATIONS

Office action dated Apr. 23, 2013 issued with respect to the basic Japanese Patent Applicatin No. 2009-128785.
Office Action dated Sep. 12, 2013 issued with respect to corresponding Chinese Patent Application No. 201010194136.2.
Office Action dated Dec. 17, 2013 issued with respect to the basic Japanese Patent Application No. 2009-128785.

\* cited by examiner

*Primary Examiner* — Yuriy Semenenko
(74) *Attorney, Agent, or Firm* — IPUSA, PLLC

(57) ABSTRACT

A substrate includes a substrate base, first contact parts arranged in a pattern on a surface of the substrate base, and leads respectively having a generally U-shape with a flexible part, a first end fixed to a corresponding one of the first contact parts, and a second end that is located a predetermined distance away from the first end relative to the surface of the substrate base. The first and second ends of each of the leads are substantially aligned in a direction perpendicular to the surface of the substrate base in a state where the second end of each lead is pushed by a target object and deformed thereby in order to electrically connect the substrate to the target object.

20 Claims, 17 Drawing Sheets

SUBSTRATE HAVING LEADS

CROSS-REFERENCE TO RELATED APPLICATIONS

This application is based upon and claims the benefit of priority of the prior Japanese Patent Application No. 2009-128785, filed on May 28, 2009, the entire contents of which are incorporated herein by reference.

BACKGROUND OF THE INVENTION

1. Field of the Invention

The present invention generally relates to substrates having leads, and more particularly to a substrate having a conductor pattern and leads connected thereto, that is suited for receiving a target object having terminals or pads to be electrically connected to the leads.

2. Description of the Related Art

FIG. 1 is a cross sectional view of an example of a conventional substrate having leads. A substrate 200 illustrated in FIG. 1 includes a housing 201 and leads (or connection terminals) 202. Only one lead 202 is visible in the cross sectional view of FIG. 1. The lead 202 is fixed within a through hole 213 of the housing 201.

The lead 202 includes connection parts 215 and 216, and a spring part 217. The connection part 215 is integrally formed on a portion of the spring part 217 that projects from an upper surface 201A of the housing 201. The connection part 215 is pushed by a pad 206 of a target object 205, such as a wiring board, and achieves electrical contact between the lead 202 and the target object 205 through contact between the connection part 215 and a surface 206A of the pad 206.

On the other hand, the connection part 216 is exposed at a lower surface 201B of the housing 201. The connection part 216 is electrically connected to a circuit board 209, such as a mother board, through an external contact part 208. Hence, the lead 202 is electrically connected to both the target object 205 and the circuit board 209.

The spring part 217 is accommodated within the through hole 213, but a portion of the spring part 217 projects from the upper surface 201A of the housing 201 as described above. Hence, when the pad 206 pushes against the connection part 215, the connection part 215 mainly slides along the surface 206A of the pad 206. An example of such a structure is proposed in a U.S. Pat. No. 7,264,486.

However, a sliding displacement of the connection part 215 along the surface 206A of the pad 206 is relatively large when the pad 206 pushes against the connection part 215. For this reason, a width of the pad 206 along a direction in which the connection part 215 slides along the surface 206A thereof needs to be relatively wide, and there was a problem in that the pads 206 provided on the target object 205 cannot be arranged at a relatively narrow pitch.

SUMMARY OF THE INVENTION

Accordingly, it is a general object of the present invention to provide a novel and useful substrate having leads, in which the problem described above is suppressed.

Another and more specific object of the present invention is to provide a substrate having leads, which enables pads of a target object that push against connection parts of the leads to be arranged at a relatively narrow pitch.

According to one aspect of the present invention, there is provided a substrate comprising a substrate base having a first surface and a second surface located opposite the first surface; a plurality of first contact parts arranged in a pattern on the first surface; and a plurality of leads respectively having a generally U-shape with a flexible part, a first end fixed to a corresponding one of the first contact parts, and a second end that is located a predetermined distance away from the first end relative to the first surface, wherein the first and second ends of each of the plurality of leads are substantially aligned in a direction perpendicular to the first surface in a state where the second end of each of the plurality of leads is pushed by a target object and deformed thereby in order to electrically connect the substrate to the target object.

Other objects and further features of the present invention will be apparent from the following detailed description when read in conjunction with the accompanying drawings.

DESCRIPTION OF THE PREFERRED EMBODIMENTS

[First Embodiment]

Figure 1:
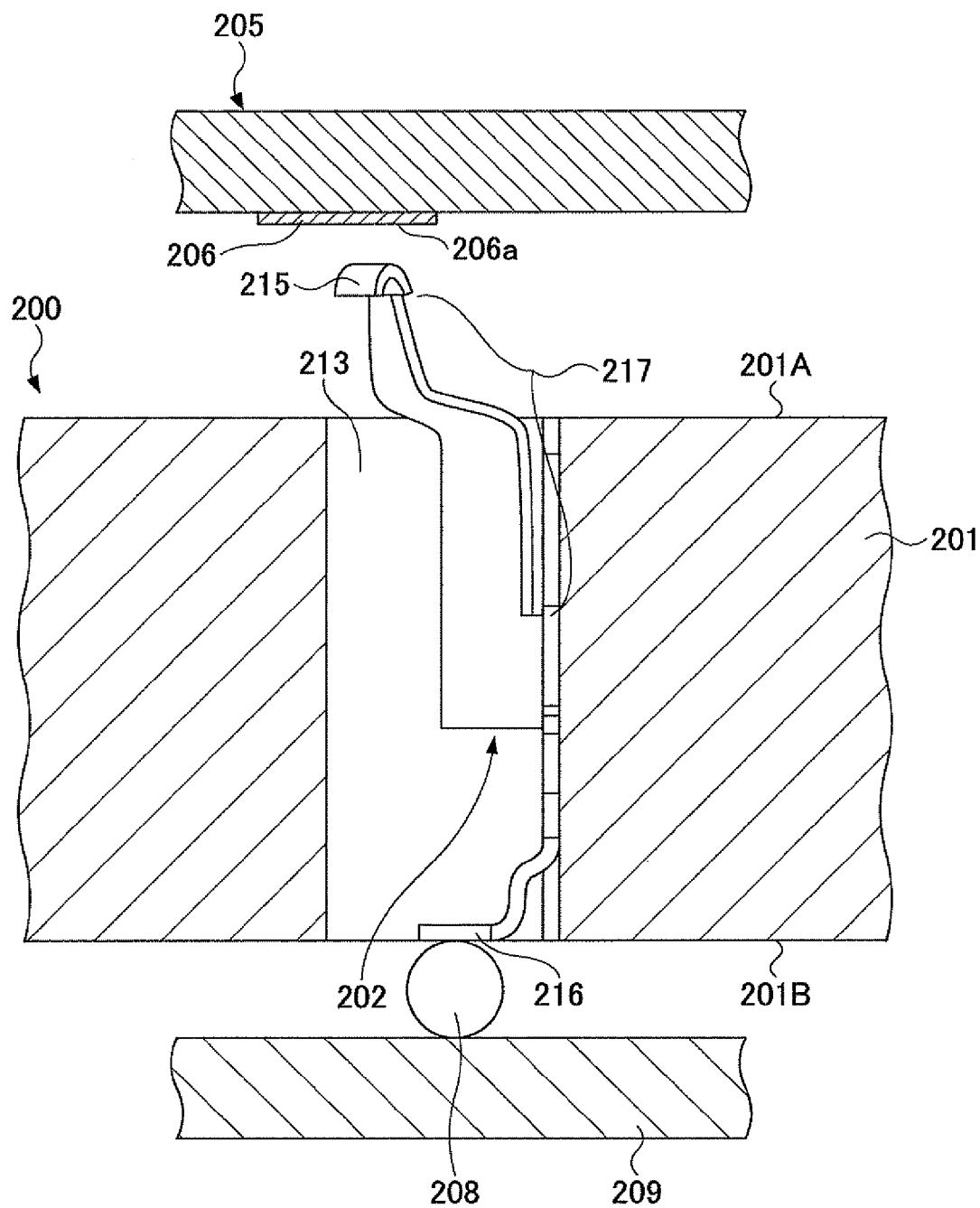
FIG. 1 is a cross sectional view of an example of a conventional substrate having leads.
Figure 2:
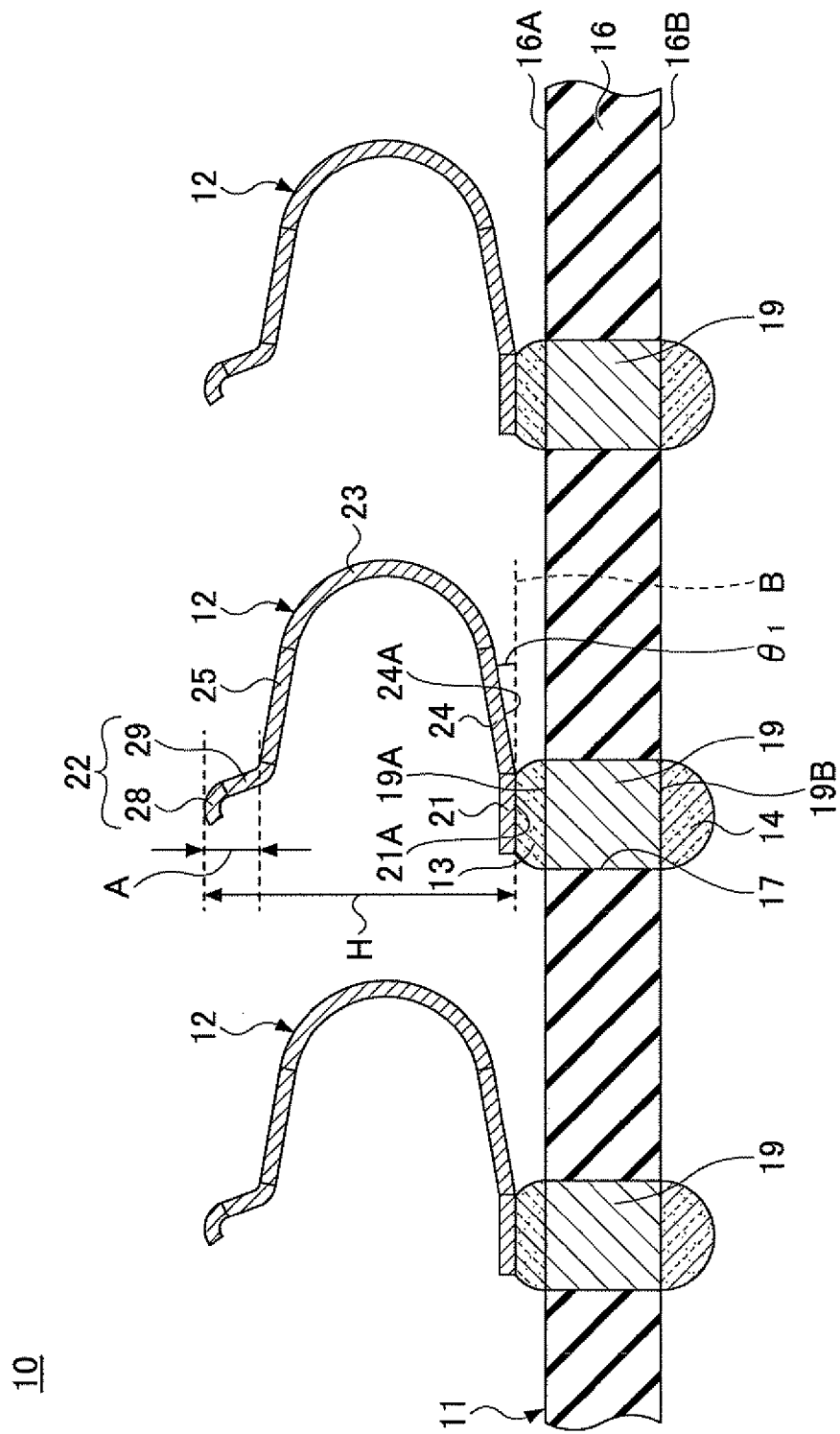
FIG. 2 is a cross sectional view illustrating a substrate having leads in a first embodiment of the present invention.

FIG. 2 is a cross sectional view illustrating a substrate having leads in a first embodiment of the present invention. A substrate 10 illustrated in FIG. 2 includes a substrate body 11, a plurality of leads 12, solder (or first contact parts) 13 arranged in a pattern, and external contact parts (or second contact parts) 14 arranged in a pattern.

The substrate body 11 has a plate-shaped substrate base 16 with a plurality of through holes (or via holes) 17, and a plurality of through connections (or vias) 19 within the corresponding through holes 17. The through connections 19 form first conductors or a first conductor pattern. For example, the substrate base 16 may be formed by a silicon substrate base or, a wiring board (or multilevel interconnection structure) having a plurality of insulator layers that are stacked and a plurality of vias provided in and wirings provided on the insulator layers.

Each through hole 17 penetrates the substrate base 16, and has a diameter of 100 μm, for example. Each through connection 19 is provided within the corresponding through hole 17, and has an end surface 19A exposed at a first surface 16A of the substrate base 16 and another end surface 19B exposed at a second surface 16B of the substrate base 16. The end surface 19A of the through connection 19 matches or approximately matches the first surface 16A of the substrate base 16. The end surface 19B of the through connection 19 matches or approximately matches the second surface 16B of the substrate base 16. The through connection 19 may be made of a suitable conductor including metals and metal alloys, such as Cu, for example.

For the sake of convenience, it is assumed in this embodiment that the substrate body 11 is formed by the substrate base 16 that is made of silicon and the through connections 19 provided within the through holes 17 therein. It is further assumed that an insulator layer (not illustrated) made of $SiO_2$, for example, is formed between each through connection 19 and the substrate base 16. However, such an insulator layer may or may not be provided depending on the material used for the substrate base 16, for example.

Figure 3:
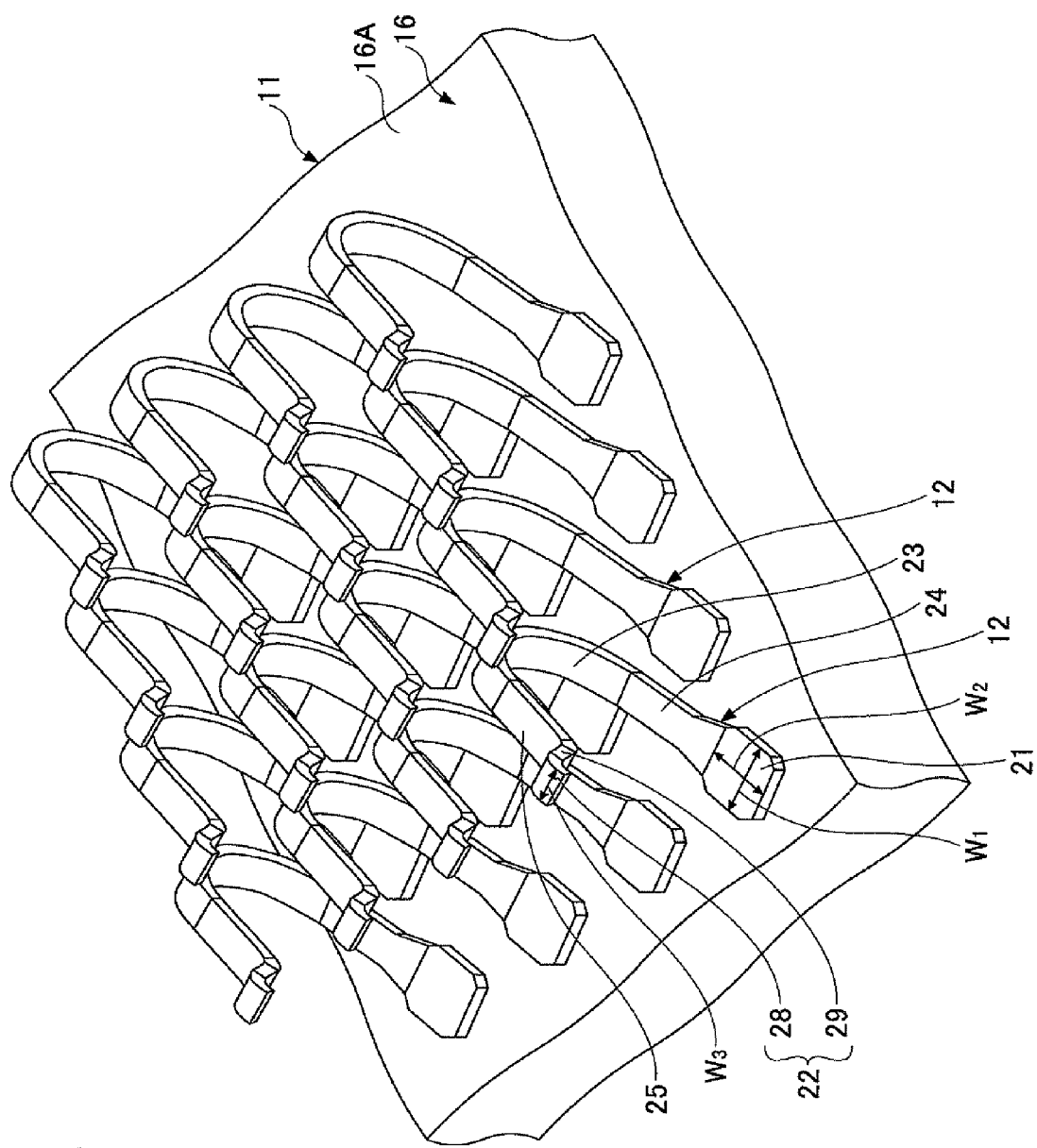
FIG. 3 is a perspective view illustrating an example of an arrangement of the leads of the substrate illustrated in FIG. 2.
Figure 4:
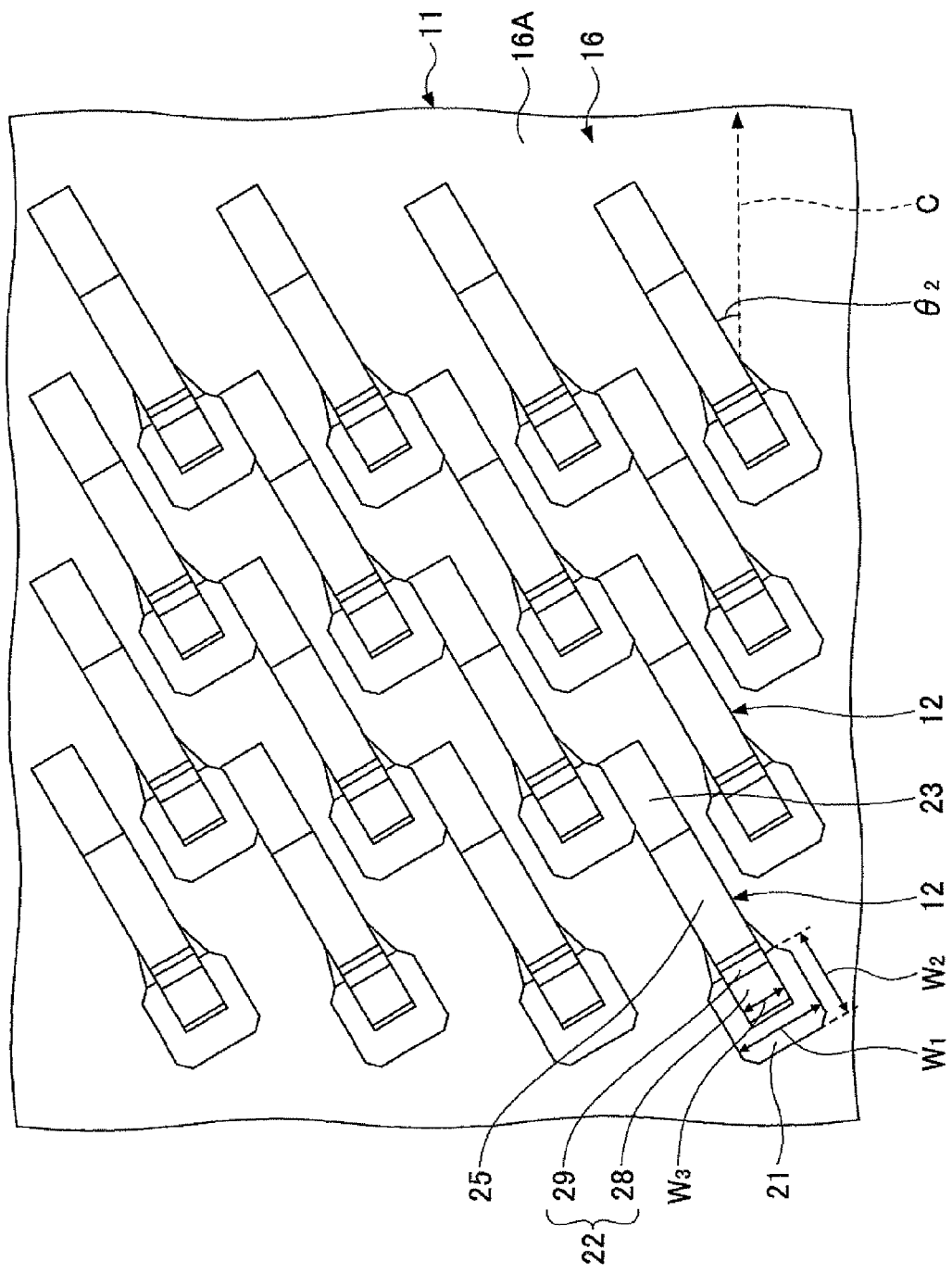
FIG. 4 is a plan view illustrating the arrangement of the leads in FIG. 3.

FIG. 3 is a perspective view illustrating an example of an arrangement of the leads 12 of the substrate 10 illustrated in FIG. 2, and FIG. 4 is a plan view illustrating the arrangement of the leads 12 in FIG. 3. In FIG. 4, the leads 12 are arranged in a direction indicated by a dotted arrow C in a plurality of rows. However, the leads 12 may be arranged in a matrix arrangement having a plurality of rows and columns or, in only a single row.

Each lead 12 illustrated in FIGS. 2 through 4 has a spring function and includes a first connection part 21, a second connection part 22, a spring part 23, a first support part 24, and a second support part 25.

The first connection part 21 has a plate shape, and is fixed to the end surface 19A of the through connection 19 through the solder 13. Hence, the first connection part 21 is electrically connected to the through connection 19. Lengths W1 and W2 of the first connection part 21 illustrated in FIGS. 3 and 4 may be 0.4 mm, for example. The first connection part 21 may have a thickness of 0.08 mm, for example.

The second connection part 22 is arranged above the first connection part 21 to oppose the first connection part 21. The second connection part 22 is electrically connected to the first connection part 21 through the spring part 23, the first support part 24 and the second support part 25. The second connection part 22 includes a projecting part 29 and a contact part 28 disposed on a tip end of the projecting part 29.

Figure 5:
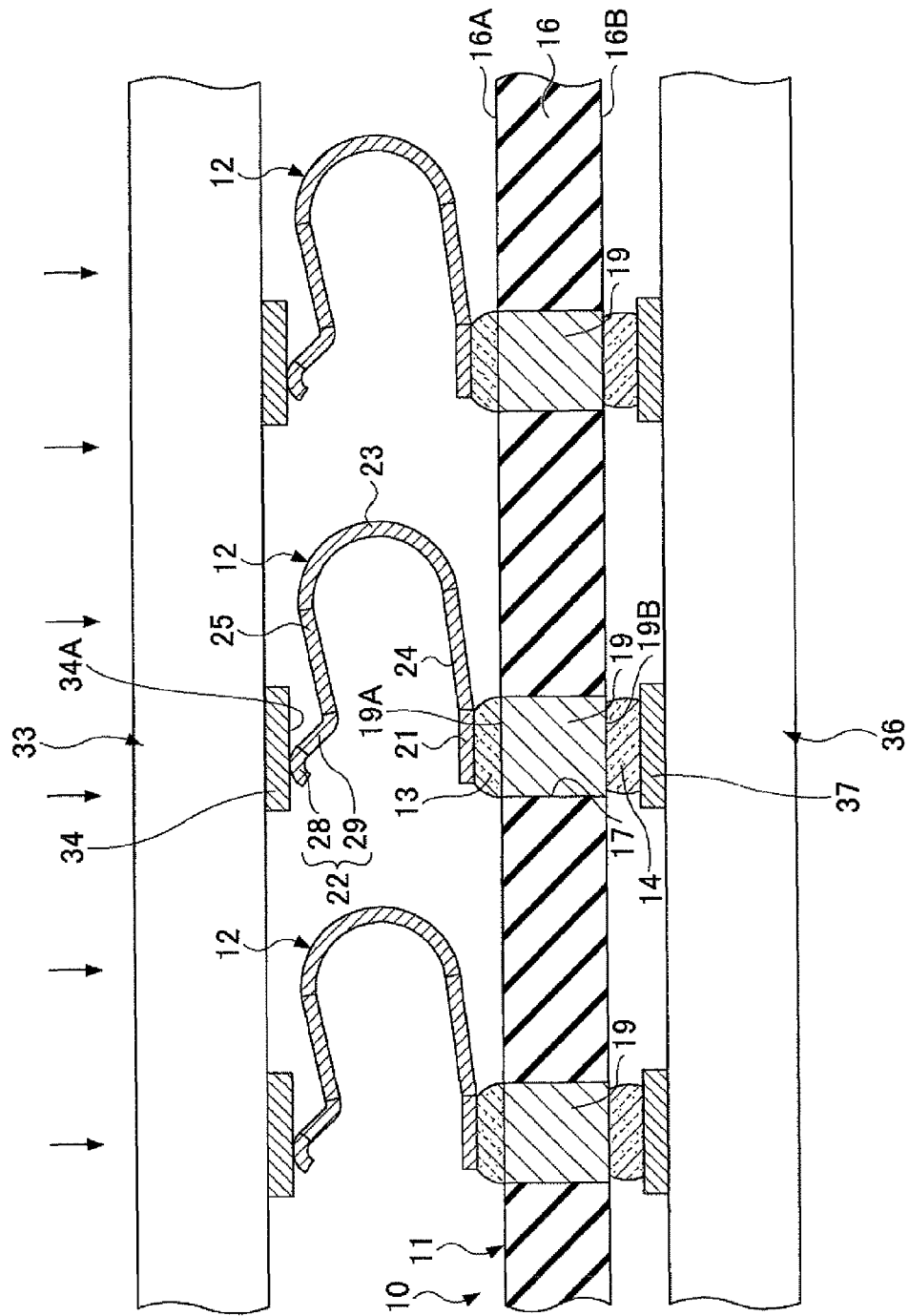
FIG. 5 is a cross sectional view illustrating the substrate in the first embodiment that is electrically connected to a target object and a circuit board.

FIG. 5 is a cross sectional view illustrating the substrate in the first embodiment that is electrically connected to a target object and a circuit board. In FIG. 5, those parts that are the same as those corresponding parts in FIGS. 2 through 4 are designated by the same reference numerals, and a description thereof will be omitted.

As illustrated in FIG. 5, the contact part 28 is pushed by a pad 34 of a target object 33 and makes contact with a surface 34A of the pad when connecting or mounting the target object 33 on the substrate 10. For example, the target object 33 may be a semiconductor package, a wiring board, a semiconductor chip or the like. A portion of the contact part 28 making contact with the surface 34A of the pad 34 has a rounded shape, in order not to damage the pad 34 upon contact. The contact part 28 moves mainly in a downward direction indicated by arrows in FIG. 5 when pushed by the pad 34 of the target object 33. This downward direction is perpendicular to the surface 34A of the pad 34. Hence, when the pad 34 of the target object 33 pushes against the contact part 28 of the second connection part 22, the spring part 23 is deformed from its original position (or initial position) and the second connection part 22 moves downward in FIG. 5 towards the first connection part 21 to a moved position closer to the first connection part 21 than the original position. Hence, the rounded portion of the contact part 28 makes contact with the surface 34A of the pad at this moved position of the spring part 23. In the state illustrated in FIG. 5, a tip end of the second correction part 22 at the contact part 28 and a tip end of the first connection part 21 are aligned or substantially aligned in the vertical direction perpendicular to the surface 16A.

Accordingly, when the surface 34A of the pad 34 makes contact with the contact part 28 of the second connection part 22, the rounded portion of the contact part 28 will not slide a relatively long distance along the surface 34A of the pad 34. For this reason, the pads 34 of the target object 33 may be arranged at a relatively narrow pitch along a horizontal direction in FIG. 5.

When actually making the electrical connection between the target object 33 and the substrate 10, the target object 33 may be pushed against and fixed with respect to the substrate 10 by use of a jig (not illustrated), such as a clamp, that is provided on the target object 33 or on the substrate 10.

The projecting part 29 illustrated in FIGS. 2 through 5 has one end thereof integrally formed on the second support part 25, and the other end (or tip end) thereof integrally formed on the contact part 28. The projecting part 29 projects from the second support part 25 in a direction towards the pad 34, that is, in a direction away from the first connection part 21. The projecting part 29 may substantially project in a direction perpendicular to the first surface 16A of the substrate base 16. By providing the projecting part 29 between the contact part 28 and the second support part 25, the target object 33 and the second support part 25 can be prevented from making contact with each other when the pad 34 of the target object 33 pushes against the contact part 28 and deforms the spring part 23, to thereby prevent damage to the leads 12 and the target object 33.

In a state where the pad 34 of the target object 33 and the second contact part 22 do not make contact with each other, the second connection part 22 may project by a distance A of 0.3 mm, for example, in a vertical direction in FIG. 2, from a reference point where the second support part 25 and the projecting part 29 join. In addition, in the state where the second connection part 22 is not pushed by the corresponding pad 34, a height H of the lead 12 from a bottom of the first connection part 21 to a top of the contact part 28 of the second connection part 22 may be 1.5 mm, for example. A length W3 of the second connection part 22 illustrated in FIGS. 3 and 4 may be 0.2 mm, for example. The second connection part 22 may have a thickness of 0.08 mm, for example.

The spring part 23 is arranged between the first and second support parts 24 and 25, and is integrally formed on the first and second support parts 24 and 25. The spring part 23 is flexible and has a spring function. The spring part 23 may be formed by a leaf spring having a generally U-shape in a non-compressed state as illustrated in FIGS. 2 and 3, for example.

The spring part 23 causes the second connection part 22 to repel in a direction towards the pad 34 when the pad 34 of the target object 33 pushes against the second connection part 22, in order to achieve a positive electrical connection between the second connection part 22 and the pad 34 without having to fix the second connection part 22 and the pad 34 together. The width and thickness of the spring part 23 may be the same as the width and thickness of the second connection part 22. In this embodiment, the second connection part 22, the spring part 23, the first support part 24 and the second support part 25 integrally form a spring member for achieving the positive electrical connection between the second connection part 22 and the pad 34. Spring constants of the second connection part 22, the spring part 23, the first support part 24 and the second support part 25 integrally forming the spring member may respectively be set to a value in a range of 0.6 N/mm to 0.8 N/mm, for example.

The first support part 24 is arranged between the spring part 23 and the first connection part 21. One end of the first support part 24 is integrally formed on one end of the spring part 23, and the other end of the first support part 24 is integrally formed on the first connection part 21. The first support part 24 has a plate shape, and includes a surface 24A that opposes the substrate body 11. The surface 24A of the first support part 24 forms an angle $\theta_1$ (other than 0) with respect to a plane B. This plane B passes a surface 21A of the first connection part 21 opposing the substrate body 11 and is parallel to the first surface 16A of the substrate base 16. The angle $\theta_1$ is an acute angle in a range of 5 degrees to 15 degrees, for example. Because the surface 24A of the first support part 24 forms the angle $\theta_1$ with respect to the plane B, it is possible to prevent the substrate body 11 and the first support part 24 from making contact with each other due to the deformation of the spring part 23 when the pad 34 of the target object 33 pushes against the contact part 28, to thereby prevent damage to the lead 12 and the substrate body 11. The width and thickness of the first support part 24 may be the same as the width and thickness of the second connection part 22.

The second support part 25 is arranged between the spring part 23 and the second connection part 22. One end of the second support part 25 is integrally formed on one end of the spring part 23, and the other end of the second support part 25 is integrally formed on the second connection part 22, that is, the projecting part 29 of the second connection part 22. The second support part 25 has a plate shape, and the width and thickness of the second support part 25 may be the same as the width and thickness of the second connection part 22.

As illustrated in FIG. 4, the leads 12 are arranged in the direction C so that each lead 12 is inclined by a predetermined angle $\theta_2$ (other than 0) with respect to the direction C. The predetermined angle $\theta_2$ may be 25 degrees to 35 degrees, for example.

Because the leads 12 are arranged with the inclination with respect to the direction C, it is possible to increase the number of leads 12 that can be arranged per unit area compared to a case where the leads 12 are arranged parallel to the direction C. For this reason, the pads 34 of the target object 33 may be arranged at a relatively narrow pitch along the horizontal direction in FIG. 5, which corresponds to the direction C.

The lead 12 having the structure described above may be formed from a conductor plate (hereinafter referred to as a metal plate) made of any suitable conductor including metals and metal alloys, such as a Cu alloy, for example, by stamping or punching the metal plate to obtain a metal piece and plating the entire surface of the metal piece. The plating may form a Ni plated layer having a thickness of 1 μm to 3 μm, for example, and additionally forming a Au plated layer having a thickness of 0.3 μm to 0.5 μm, for example, on the Ni plated layer at a portion of the metal piece corresponding to the first connection part 21 and the contact part 28. The metal piece having the Ni plated layer and the Au plated layer may be bent into the shape of the lead 12. The Cu alloy usable for the metal plate includes phosphor bronze and beryllium copper.

The lead 12 having the structure described above may also be formed from a conductor plate (or metal plate) made of any suitable conductor including metals and metal alloys, such as a Cu alloy, for example, by etching the metal plate to obtain a metal piece and bending the metal piece into the shape of the lead 12. Of course, the metal piece may be plated before or after the bending.

The solder 13 is provided on the end surface 19A of the through connection 19, as illustrated in FIGS. 2 and 5. The solder 13 fixes the first connection part 21 of the lead 12 to the end surface 19A of the through connection 19. Hence, the solder 13 electrically connects the lead 12 and the corresponding through connection 19.

The external contact part 14 is provided on the end surface 19B of the through connection 19. The external contact part 14 connects to a corresponding pad 37 on a circuit board 36, such as a mother board, that is another target object. Hence, the external contact parts 14 electrically connect the circuit board 36 and the substrate body 11. For example, the external contact part 14 may be formed by solder, conductor paste or the like. The conductor paste used for the external contact part 14 may include Ag paste and conductive resin paste, for example.

According to this embodiment, when the pad 34 of the target object 33 pushes against the second connection part 22 of the lead 12, the spring part 23 is deformed and the second connection part 22 moves in a direction towards the first connection part 21. More particularly, the second connection part 22 moves in the direction perpendicular to the surface 34A of the pad 34, and towards the first connection part 21. The surface 34A of the pad 34 and the second connection part 22 make contact in the state where the second connection part 22 has moved towards the first connection part 21. Hence, when the second connection part 22 makes contact with the surface 34A of the pad 34, the second connection part 22 (that is, the contact part 28) will not slide a relatively long distance along the surface 34A of the pad 34. For this reason, the pads 34 of the target object 33 can be arranged at a relatively narrow pitch along the direction C described above in conjunction with FIG. 4.

The lead 12 is fixed to the end surface 19A of the through connection 19 by use of the solder 13 in this embodiment. However, it is of course possible to use conductor paste or the like in place of the solder 13. The conductor paste used in place of the solder 13 may include Ag paste and conductive resin paste, for example.

Figure 6:
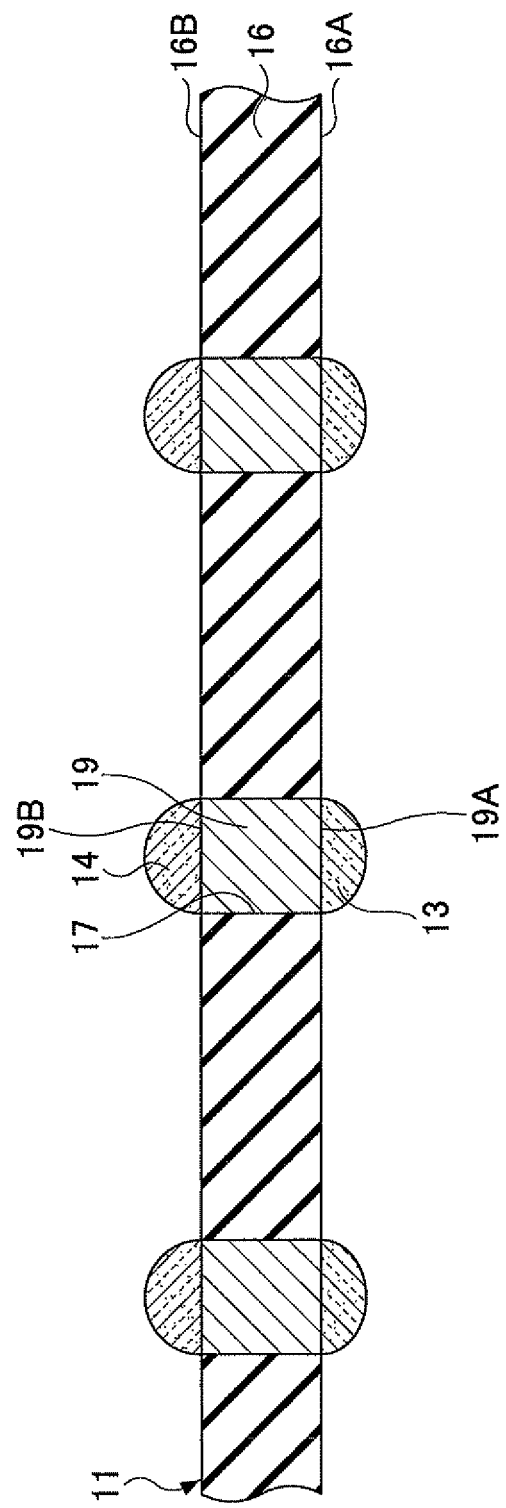
FIG. 6 is a cross sectional view illustrating the substrate in the first embodiment at a fabrication stage thereof.

Next, a description will be given of the fabrication processes for fabricating the substrate 10 of the first embodiment described above, by referring to FIGS. 6 through 10. FIGS. 6 through 10 are cross sectional views illustrating the substrate 10 in the first embodiment at fabrication stages thereof. FIGS. 6 and 9 illustrate the substrate body 11 in an upside-down state compared to FIG. 2.

The substrate body 11 illustrated in FIG. 6 having the substrate base 16 with the plurality of through holes 17, the through connections 19, the external contact parts 14 and the solder 13 is formed by a known process. The end surfaces 19A of the through connections 19 are formed to approximately match the first surface 16A of the substrate base 16, and the end surfaces 19B of the through connections 19 are formed to approximately match the second surface 16B of the substrate base 16.

For example, the substrate base 16 is formed by a silicon substrate base or, a wiring board (or multilevel interconnection structure) having a plurality of insulator layers that are stacked and a plurality of vias provided in and wirings provided on the insulator layers. Each through hole 17 has a diameter of 100 μm, for example. Each through connection 19 is formed by plating, for example. When the silicon substrate base is used for the substrate base 16, an insulator layer (not illustrated) is formed on the side wall defining each through hole 17 in order to positively insulate the substrate base 16 from the through connections 19. The through connection 19 is made of Cu, for example.

Next, the solder 13 is formed on the end surface 19A of each through connection 19, and the external contact part 14 is formed on the end surface 19B of each through connection 19. For example, the external contact part 14 is formed by solder, conductor paste or the like. The conductor paste used for the external contact part 14 may include Ag paste and conductive resin paste, for example. A conductor paste or the like may be used in place of the solder 13. The conductor paste used in place of the solder 13 may include Ag paste and conductive resin paste, for example.

Figure 7:
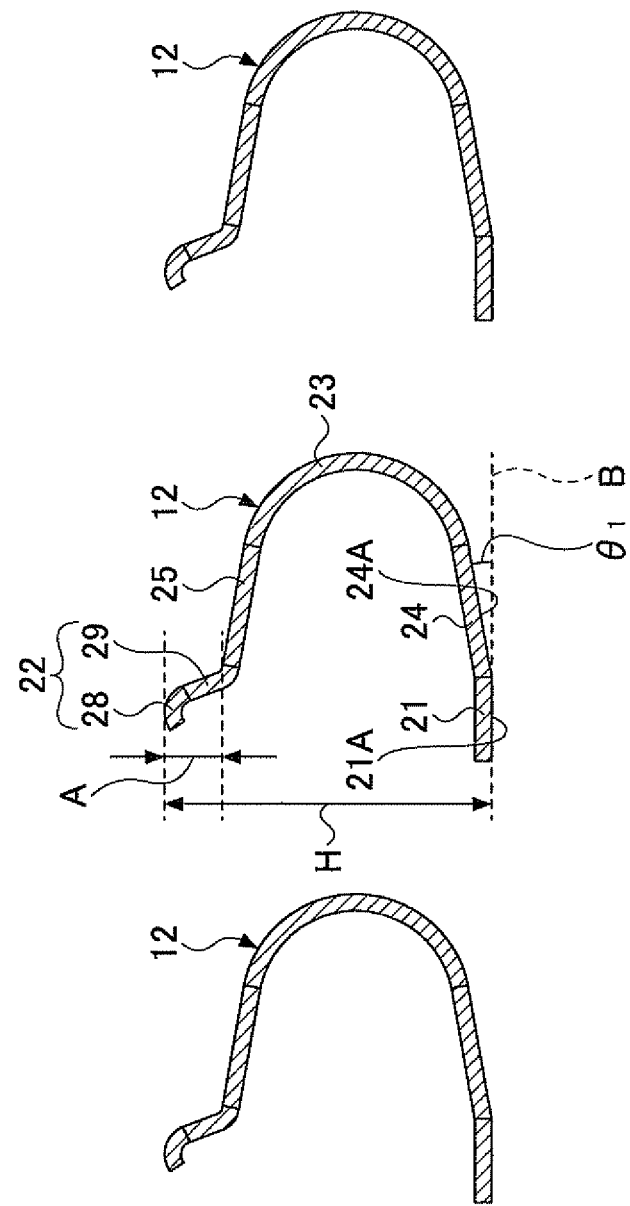
FIG. 7 is a cross sectional view illustrating the substrate in the first embodiment at a fabrication stage thereof.

Next, the plurality of leads 12 illustrated in FIG. 7 are formed. Each lead 12 that is formed includes the first connection part 21, the second connection part 22, the spring part 23, the first support part 24 and the second support part 25. The lead 12 having the structure described above is formed from a metal plate (not illustrated) made of a Cu alloy, for example, by stamping or punching the metal plate to obtain a metal piece and plating the entire surface of the metal piece. The plating forms a Ni plated layer to a thickness of 1 μm to 3 μm, for example, and additionally forms a Au plated layer to a thickness of 0.3 μm to 0.5 μm, for example, on the Ni plated layer at a portion of the metal piece corresponding to the first connection part 21 and the contact part 28. The metal piece having the Ni plated layer and the Au plated layer is bent into the shape of the lead 12. The Cu alloy usable for the metal plate includes phosphor bronze and beryllium copper.

Alternatively, the lead 12 having the structure described above may be formed from a metal plate (not illustrated) made of a Cu alloy, for example, by etching the metal plate to obtain a metal piece and bending the metal piece into the shape of the lead 12. Of course, the metal piece may be plated before or after the bending.

Because the leads 12 are formed to have the structure described above, when the pad 34 of the target object 33 pushes against the second connection part 22 of the lead 12 after the substrate 10 is completed, the spring part 23 is deformed and the second connection part 22 moves in the direction towards the first connection part 21. More particularly, the second connection part 22 moves in the direction perpendicular to the surface 34A of the pad 34, and towards the first connection part 21. The surface 34A of the pad 34 and the second connection part 22 make contact in the state where the second connection part 22 has moved towards the first connection part 21. Hence, when the second connection part 22 makes contact with the surface 34A of the pad 34, the second connection part 22 (that is, the contact part 28) will not slide a relatively long distance along the surface 34A of the pad 34. For this reason, the surface 34A of each pad 34 of the target object 33 does not need to have a relatively large area that extends a relatively long distance in the horizontal direction in FIG. 5 described above. As a result, the pads 34 of the target object 33 can be arranged at a relatively narrow pitch along the direction C described above in conjunction with FIG. 4.

In the lead forming process of FIG. 7, the leads 12 are desirably formed so that the contact part 28 of the second contact part 22 making contact with the surface 34A of the pad 34 has a rounded shape. The rounded shape of the contact part 28 prevents the pad 34 from becoming damaged when the pad 34 pushes against the contact part 28.

Further, in the lead forming process of FIG. 7, the projecting part 29 is desirably formed between the contact part 28 and the second support part 25 to project from the second support part 25 towards the pad 34 of the target object 33 that is to be connected to or mounted on the substrate body 11. The projecting part 29 prevents the target object 33 from making contact with the second support part 25 when the pad 34 of the target object 33 pushes against the contact part 28, in order to prevent the lead 12 and the target object 33 from becoming damaged due to the contact between the target object 33 and the second support part 25.

In a state where the pad 34 of the target object 33 and the second contact part 22 do not make contact with each other, the second connection part 22 projects by the distance A of 0.3 mm, for example, in the vertical direction in FIG. 7, from the reference point where the second support part 25 and the projecting part 29 join. In addition, in the state where the second connection part 22 is not pushed by the corresponding pad 34, the height H of the lead 12 from the bottom of the first connection part 21 to the top of the contact part 28 of the second connection part 22 is 1.5 mm, for example.

In addition, the surface 24A of the first support part 24 forms the angle $\theta_1$ with respect to a plane B in FIG. 7. This plane B passes the surface 21A of the first connection part 21 opposing the substrate body 11 and is parallel to the first surface 16A of the substrate base 16 when the lead 12 is later connected to the substrate body 11. The angle $\theta_1$ is an acute angle in the range of 5 degrees to 15 degrees, for example. Because the surface 24A of the first support part 24 forms the angle $\theta_1$ with respect to the plane B, it is possible to prevent the substrate body 11 and the first support part 24 from making contact with each other due to the deformation of the spring part 23 when the pad 34 of the target object 33 pushes against the contact part 28, to thereby prevent damage to the lead 12 and the substrate body 11.

Figure 8:
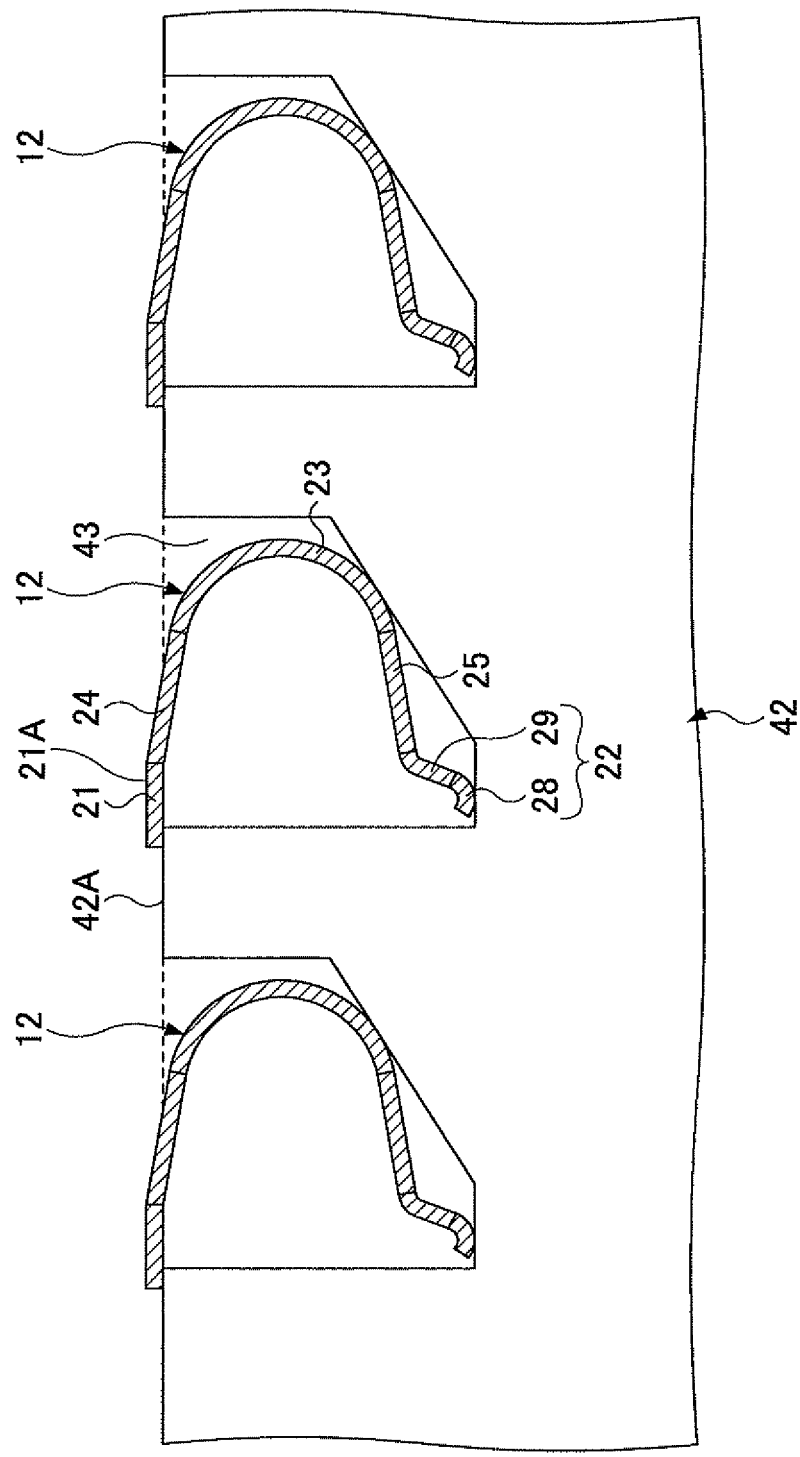
FIG. 8 is a cross sectional view illustrating the substrate in the first embodiment at a fabrication stage thereof.
Figure 9:
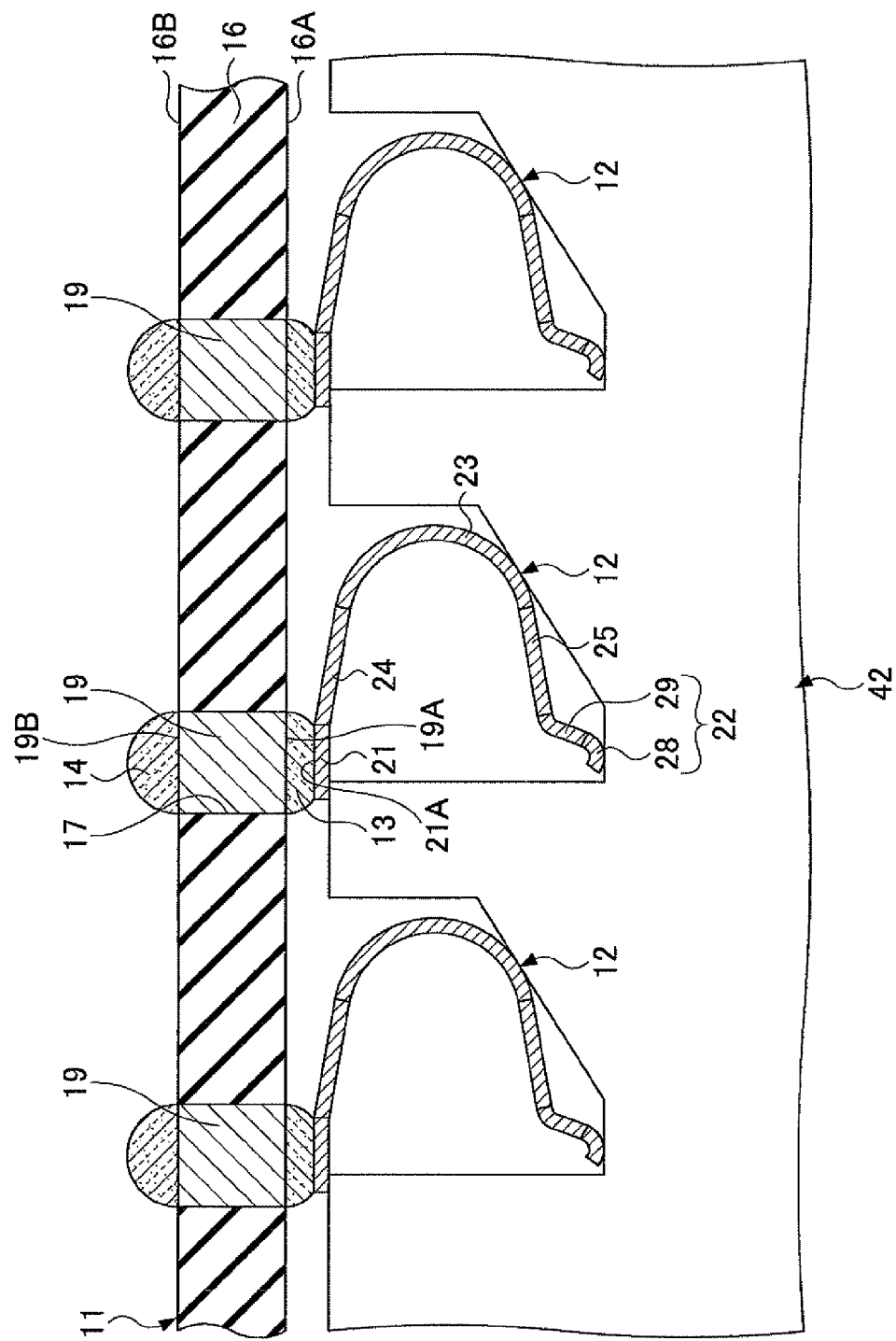
FIG. 9 is a cross sectional view illustrating the substrate in the first embodiment at a fabrication stage thereof.

Next, the lead 12 illustrated in FIG. 7 is accommodated within each of a plurality of lead accommodating recesses 43 of a lead arranging member 42 illustrated in FIG. 8. More particularly, one lead 12 is accommodated within one lead accommodating recess 43 by filling or, by picking and placing. The lead 12 is accommodated within the lead accommodating recess 43 so that a portion of the surface of the first connection part 21 located opposite the surface 21A makes contact with an upper surface 42A of the lead arranging member 42. The lead accommodating recesses 43 are arranged with a layout corresponding to a layout of the inclined leads 12 illustrated in FIGS. 3 and 4 described above.

Thereafter, the solder 13 of the substrate body 11 illustrated in FIG. 6 is melted by heat and the melted solder 13 is caused to make contact with the surface 21A of the first connection part 21 as illustrated in FIG. 9. The solder 13, when hardened, fixes the lead 12 to the end surface 19A of the through connection 19.

As illustrated in FIG. 4 described above, the leads 12 are arranged in the direction C so that each lead 12 is inclined by the predetermined angle $\theta_2$ with respect to the direction C. The predetermined angle $\theta_2$ may be 25 degrees to 35 degrees, for example. Because the leads 12 are arranged with the inclination with respect to the direction C, it is possible to increase the number of leads 12 that can be arranged per unit area compared to a case where the leads 12 are arranged parallel to the direction C. For this reason, the pads 34 of the target object 33 may be arranged at a relatively narrow pitch along the horizontal direction in FIG. 5, which corresponds to the direction C.

Figure 10:
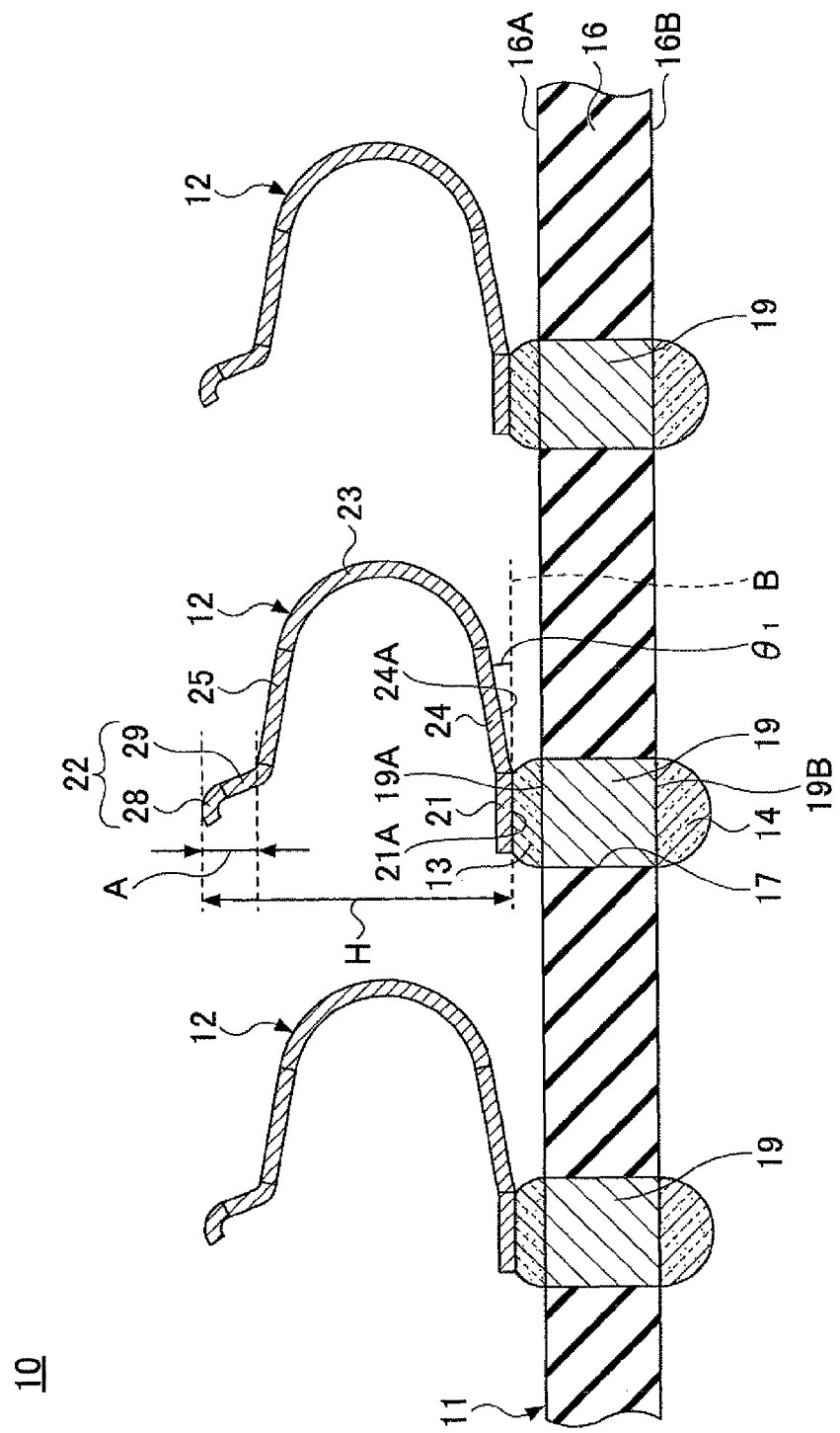
FIG. 10 is a cross sectional view illustrating the substrate in the first embodiment at a fabrication stage thereof.

Next, the leads 12 that are fixed to the substrate body 11 by the solder 13 are removed from the corresponding lead accommodating recesses 43 of the lead arranging member 42, and the substrate body 11 is turned upside down as illustrated in FIG. 10. As a result, the substrate 10 having the leads 12 in accordance with the first embodiment is fabricated.

[Second Embodiment]

Figure 11:
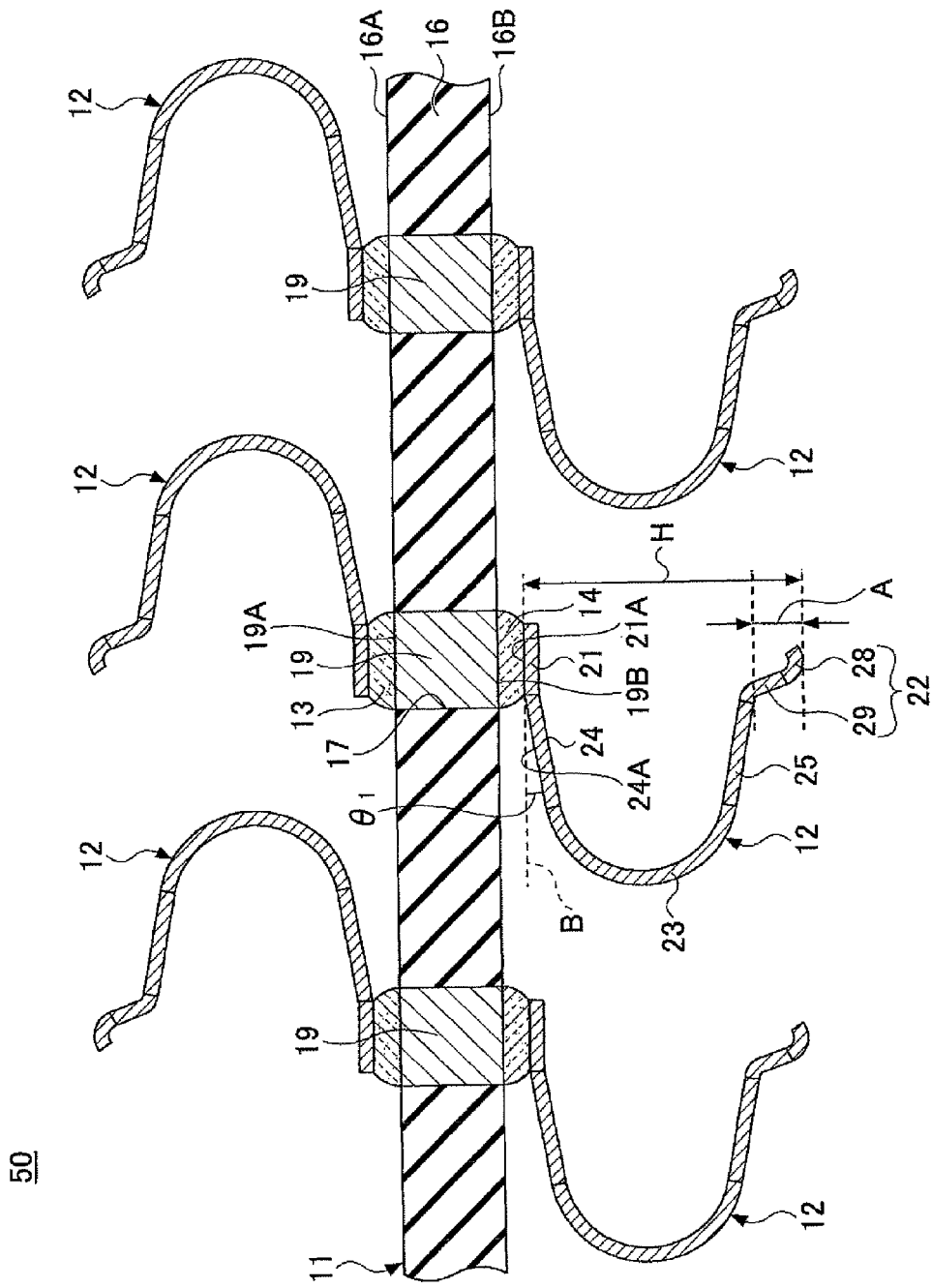
FIG. 11 is a cross sectional view illustrating a substrate having leads in a second embodiment of the present invention.
Figure 12:
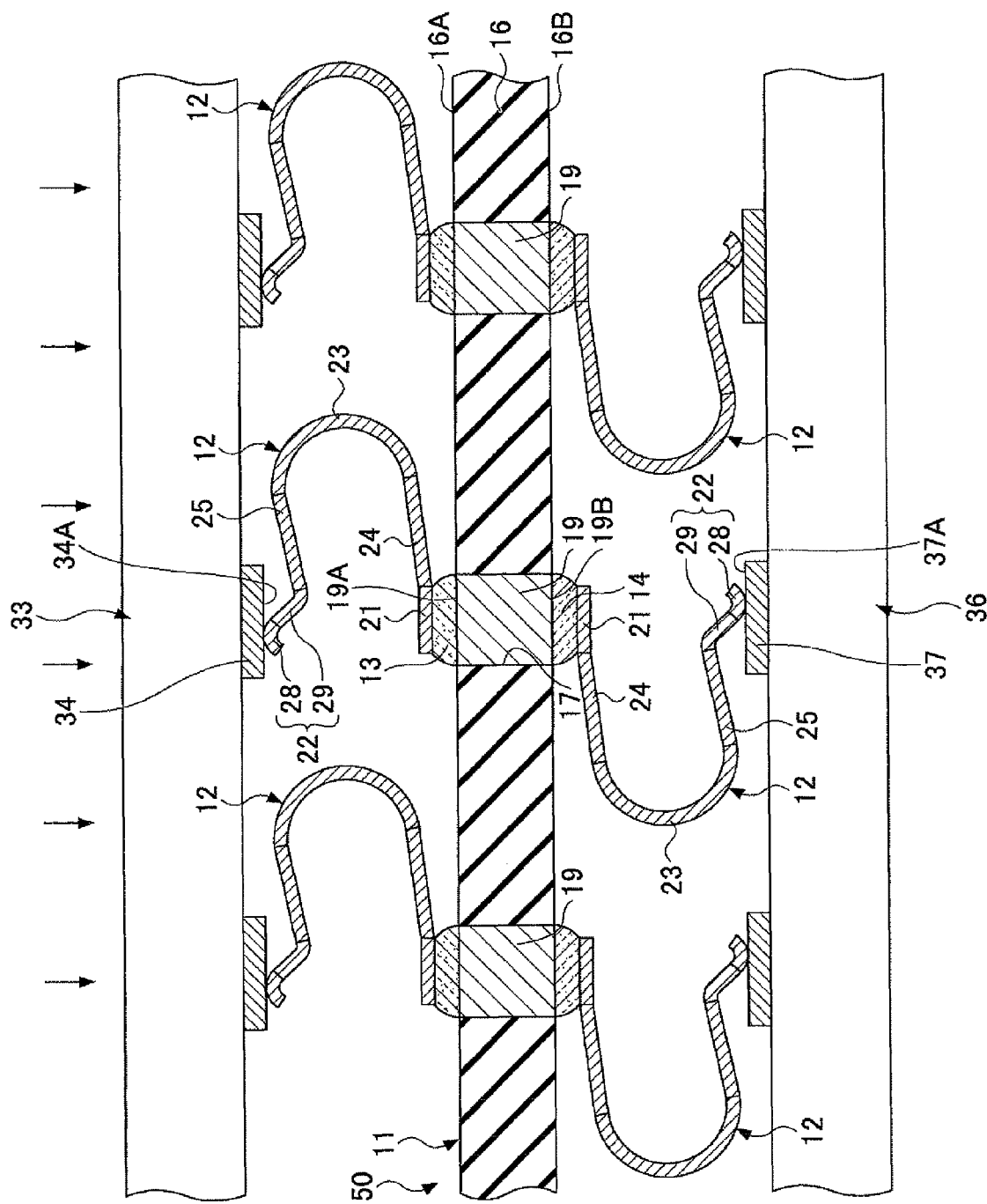
FIG. 12 is a cross sectional view illustrating the substrate in the second embodiment that is electrically connected to a target object and a circuit board.

FIG. 11 is a cross sectional view illustrating a substrate having leads in a second embodiment of the present invention, and FIG. 12 is a cross sectional view illustrating the substrate in the second embodiment that is electrically connected to a target object and a circuit board. In FIGS. 11 and 12, those parts that are the same as those corresponding parts in FIGS. 2 through 10 are designated by the same reference numerals, and a description thereof will be omitted.

A substrate 50 of the second embodiment illustrated in FIGS. 11 and 12 includes external contact parts 14 provided with corresponding leads 12. Otherwise, the substrate 50 is basically the same as the substrate 10 of the first embodiment.

The leads 12 provided on the external contact parts 14 are arranged on the second surface 16B of the substrate base 16, and electrically connect to the corresponding through connections 19 through the external contact parts 14. The second connection part 22 of the leads 12 that are arranged on the second surface 16B of the substrate base 16 is not fixed to the corresponding pad 37 on the circuit board 36, and electrically connects to the circuit board 36 by simply making contact with the surface 37A of the corresponding pad 37.

The substrate 50 of the second embodiment having the structure described above can obtain effects similar to those obtainable by the substrate 10 of the first embodiment.

In addition, the substrate 50 of the second embodiment may be fabricated by processes similar to those described above that are used to fabricate the substrate 10 of the first embodiment, except that the processes described in conjunction with FIGS. 8 and 9 need to be carried out two times.

For example, the external contact part 14 may be formed by solder, conductor paste or the like. The conductor paste used for the external contact part 14 may include Ag paste and conductive resin paste, for example. However, it is of course possible to use conductor paste or the like in place of the solder 13. The conductor paste used in place of the solder 13 may include Ag paste and conductive resin paste, for example.

[Third Embodiment]

Figure 13:
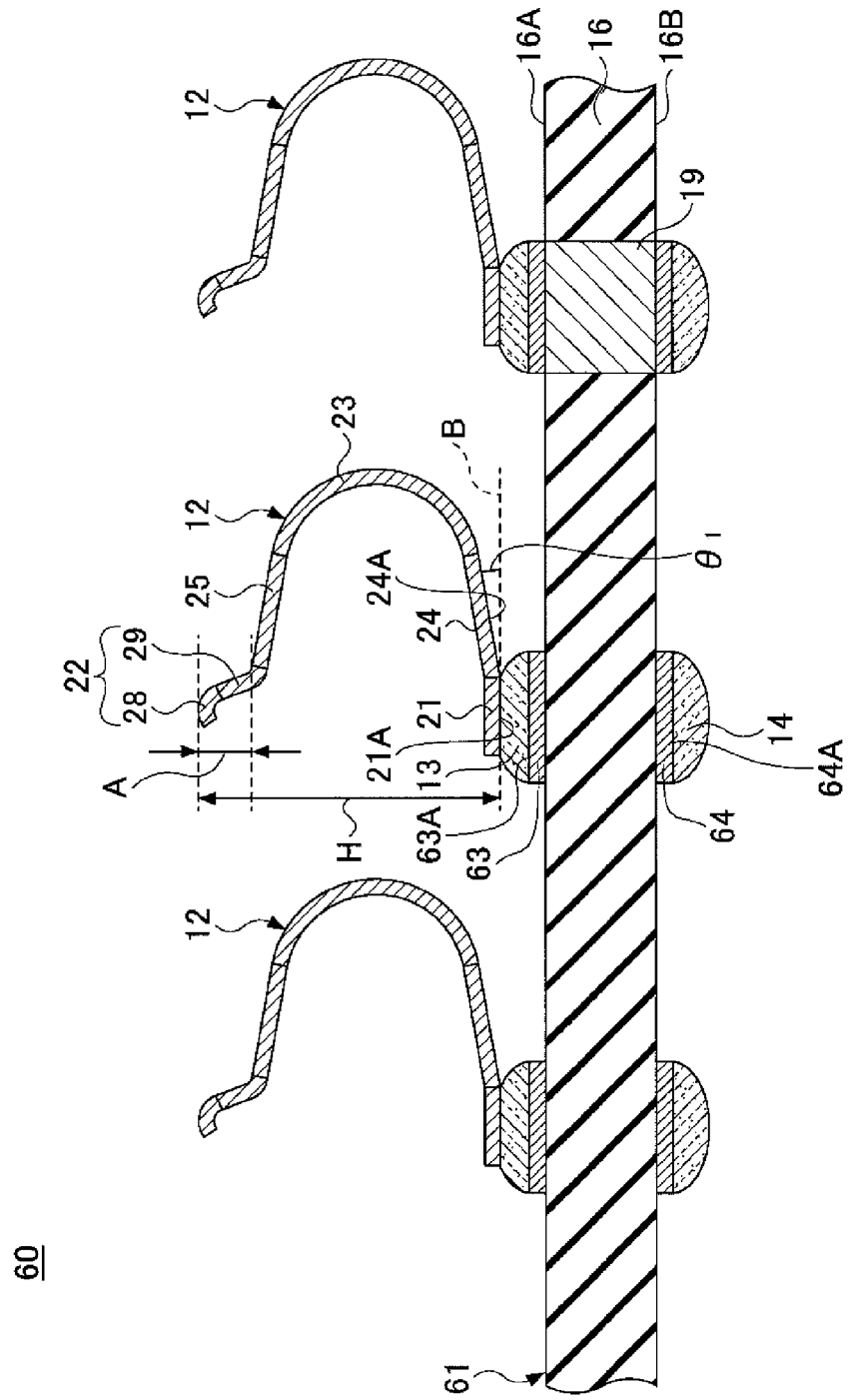
FIG. 13 is a cross sectional view illustrating a substrate having leads in a third embodiment of the present invention.
Figure 14:
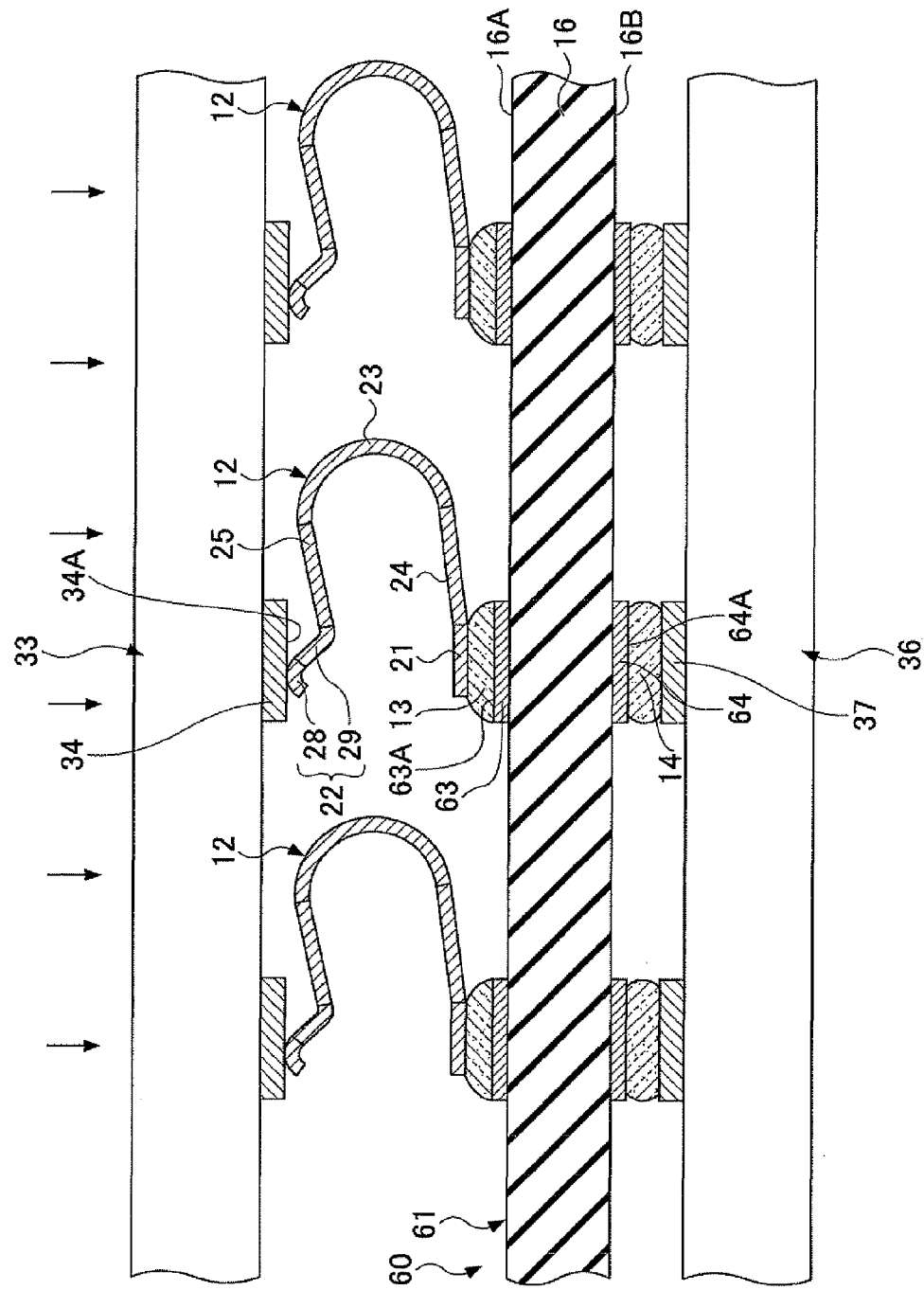
FIG. 14 is a cross sectional view illustrating the substrate in the third embodiment that is electrically connected to a target object and a circuit board.

FIG. 13 is a cross sectional view illustrating a substrate having leads in a third embodiment of the present invention, and FIG. 14 is a cross sectional view illustrating the substrate in the third embodiment that is electrically connected to a target object and a circuit board. In FIGS. 13 and 14, those parts that are the same as those corresponding parts in FIGS. 2 through 10 are designated by the same reference numerals, and a description thereof will be omitted.

A substrate 60 of the third embodiment illustrated in FIGS. 13 and 14 includes a substrate body 61 in place of the substrate body 11 of the substrate 10. Otherwise, the substrate 60 is basically the same as the substrate 10 of the first embodiment.

The substrate body 61 includes a substrate base 16, pads 63 forming first conductors or a first conductor pattern, and pads 64 forming second conductors or a second conductor pattern. The substrate base 16 may be formed by a circuit board having vias and wirings formed in a build-up substrate or a glass epoxy substrate. The pads 63 are provided on the surface 16A of the substrate base 16. Each pad 63 is electrically connected to a corresponding lead 12 through solder 13 provided on a contact surface 63A of the pad 63.

The pads 64 are provided on the surface 16B of the substrate base 16. Each pad 64 is electrically connected to a corresponding pad 63 via a wiring pattern, such as vias and wirings (only one illustrated as the connection 19 for the sake of convenience), embedded in the substrate base 16. The pad 64 electrically connects to a pad 37 provided on the circuit board 36 through an external contact part 14 provided on a contact surface 64A of the pad 64.

The substrate 60 of the third embodiment having the structure described above can obtain effects similar to those obtainable by the substrate 10 of the first embodiment.

In addition, the substrate 60 of the third embodiment may be fabricated by processes similar to those described above that are used to fabricate the substrate 10 of the first embodiment.

It is of course possible to use conductor paste or the like in place of the solder 13 in order to fix the lead 12 to the contact surface 63A of the corresponding pad 63. The conductor paste used in place of the solder 13 may include Ag paste and conductive resin paste, for example.

[Fourth Embodiment]

Figure 15:
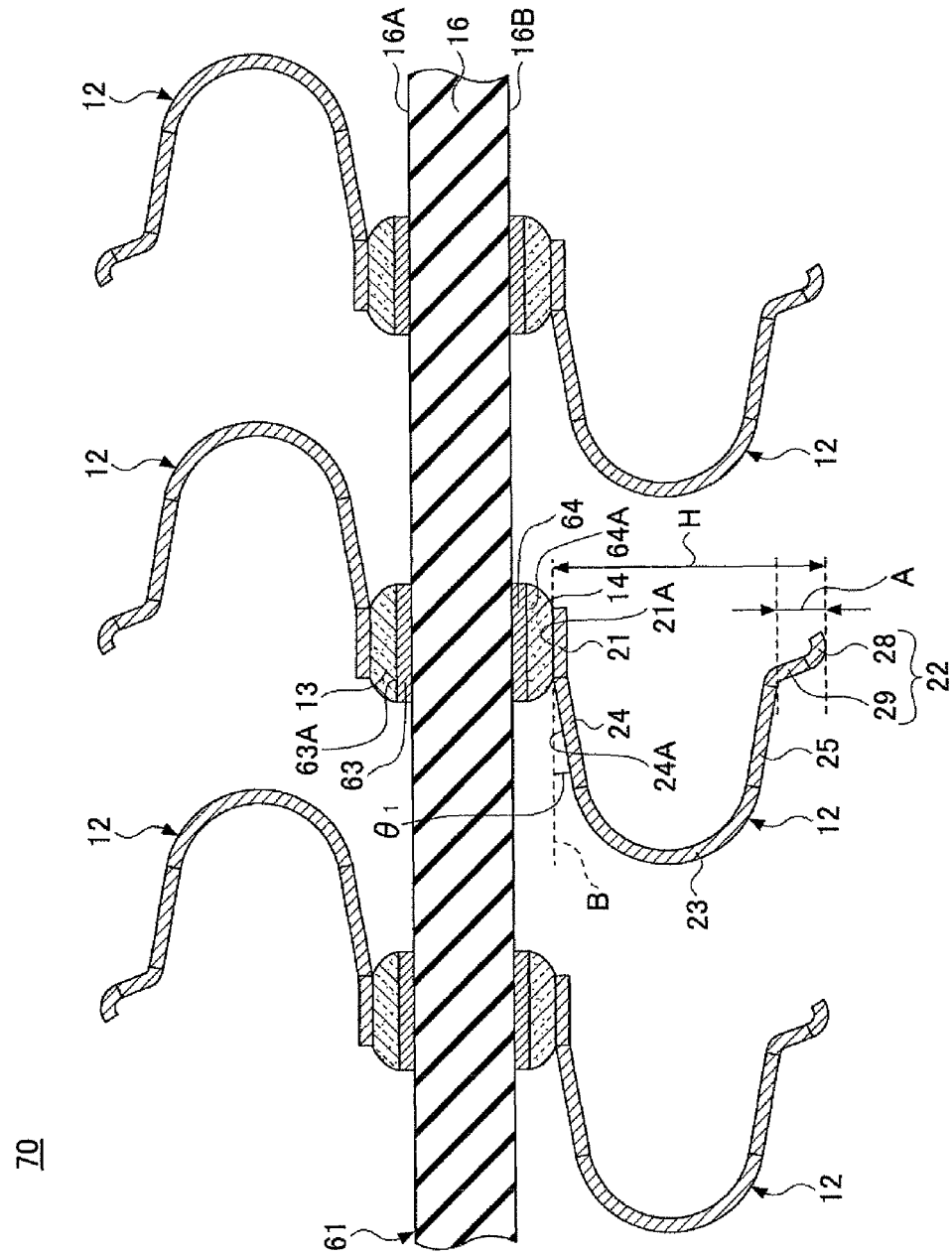
FIG. 15 is a cross sectional view illustrating a substrate having leads in a fourth embodiment of the present invention.
Figure 16:
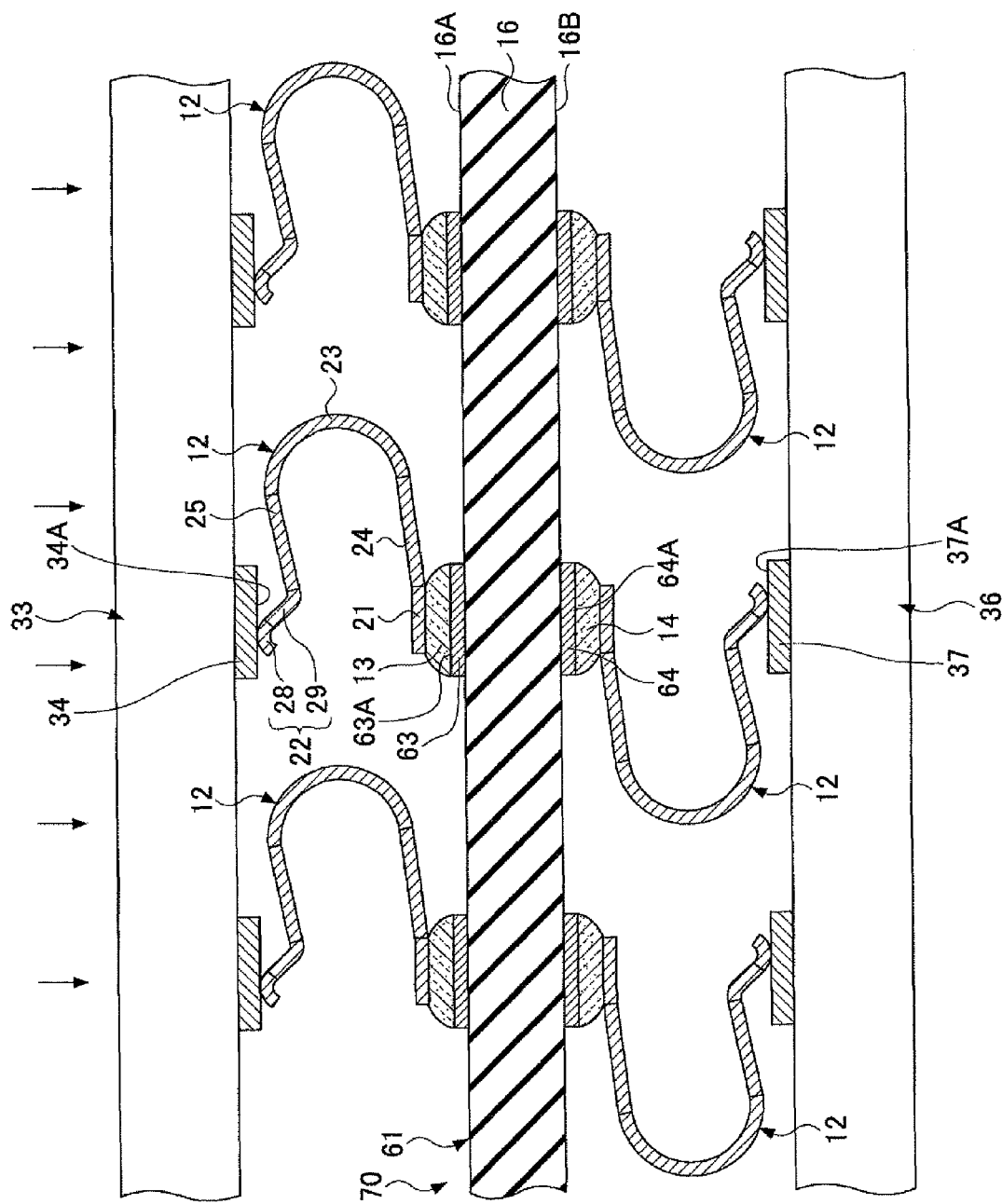
FIG. 16 is a cross sectional view illustrating the substrate in the fourth embodiment that is electrically connected to a target object and a circuit board.

FIG. 15 is a cross sectional view illustrating a substrate having leads in a fourth embodiment of the present invention, and FIG. 16 is a cross sectional view illustrating the substrate in the fourth embodiment that is electrically connected to a target object and a circuit board. In FIGS. 15 and 16, those parts that are the same as those corresponding parts in FIGS. 13 and 14 are designated by the same reference numerals, and a description thereof will be omitted.

A substrate 70 of the fourth embodiment illustrated in FIGS. 15 and 16 includes leads 12 provided on external contact parts 14 of the substrate 60 of the third embodiment. Otherwise, the substrate 70 is basically the same as the substrate 60 of the third embodiment.

Each lead 12 provided on the external contact part 14 is arranged on the surface 16B of the substrate body 16, and electrically connects to a corresponding pad 64 through the external connection part 14. The second connection part 22 of each lead 12 arranged on the surface 16B of the substrate base 16 is electrically connected to the circuit board 36 by making contact with a surface 37A of a corresponding pad 37, without being fixed to the corresponding pad 37. Hence, the substrate 70 is electrically connected to a circuit board 36 via the leads 12 arranged on the surface 16B of the substrate base 16, as illustrated in FIG. 16.

The substrate 70 of the fourth embodiment having the structure described above can obtain effects similar to those obtainable by the substrate 10 of the first embodiment.

In addition, the substrate 70 of the fourth embodiment may be fabricated by processes similar to those described above that are used to fabricate the substrate 10 of the first embodiment, except that the processes described in conjunction with FIGS. 8 and 9 need to be carried out two times.

For example, the external contact part 14 may be formed by solder, conductor paste or the like. The conductor paste used for the external contact part 14 may include Ag paste and conductive resin paste, for example. However, it is of course possible to use conductor paste or the like in place of the solder 13. The conductor paste used in place of the solder 13 may include Ag paste and conductive resin paste, for example.

[Modification]

The substrates 10, 50, 60 and 70 of the first, second, third and fourth embodiments having the leads 12, may be used as an interposer or a socket in order to connect an electronic part and a circuit board 36, for example. A semiconductor package is used in place of the target object 33 illustrated in FIG. 5 when connecting or mounting the semiconductor package on any of the substrates 10, 50, 60 and 70.

In addition, the substrates 10, 50, 60 and 70 of the first, second, third and fourth embodiments having the leads 12, may be used as a contact probe for making electrical tests on electronic parts. In this case, the leads 12 are used as pins of the probe.

Figure 17:
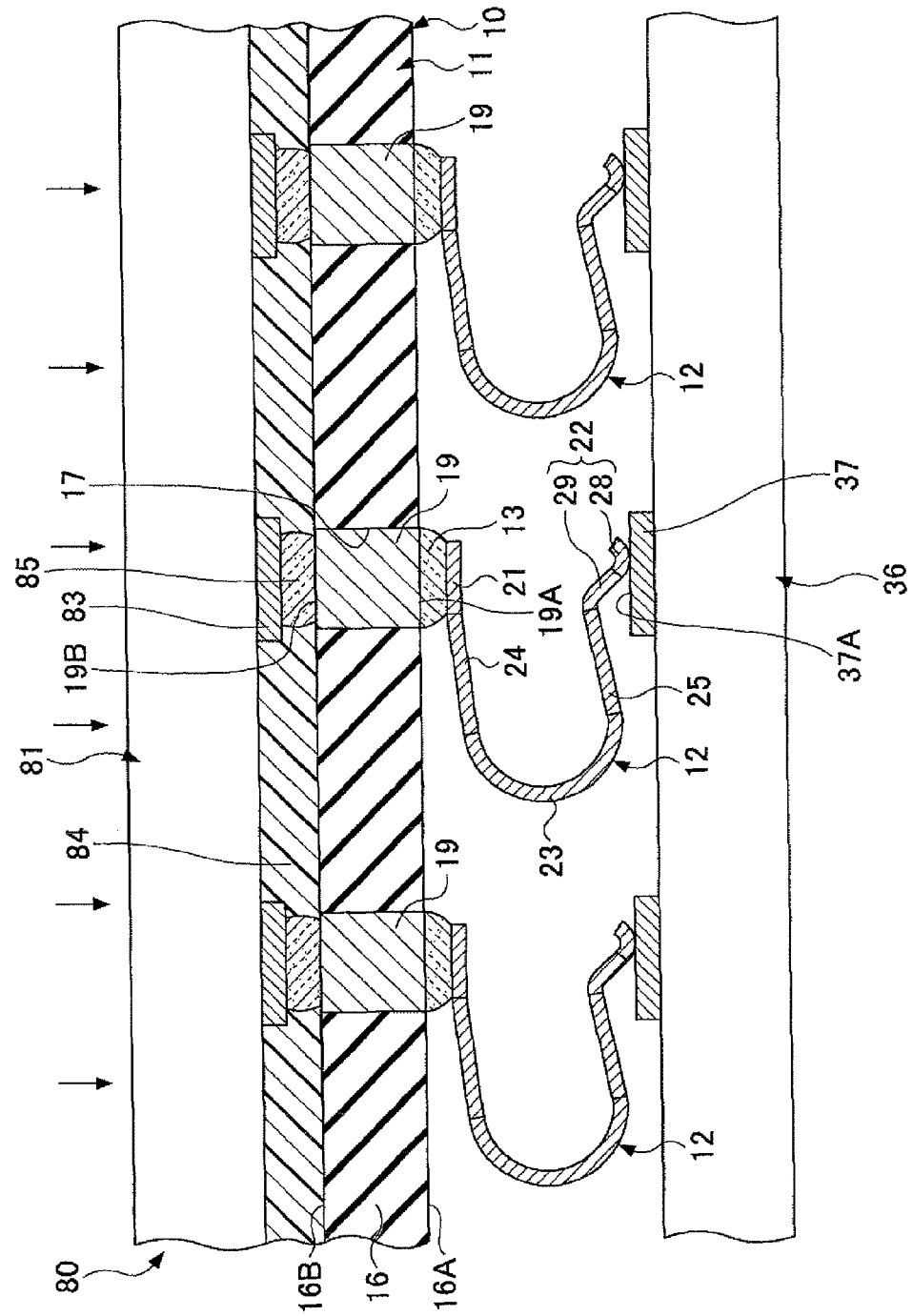
FIG. 17 is a cross sectional view illustrating an example of the substrate applied to a semiconductor package.

FIG. 17 is a cross sectional view illustrating an example of the substrate applied to the semiconductor package. In FIG. 17, those parts that are the same as those corresponding parts in FIG. 5 are designated by the same reference numerals, and a description thereof will be omitted. FIG. 17 illustrates a case where a semiconductor package 80 includes the substrate 10 of the first embodiment having the leads 12, and the semiconductor package 80 is electrically connected to the pads 37 of the circuit board 36. In FIG. 17, however, the substrate 10 is arranged upside down compared to FIG. 5, and bumps 85 are provided in place of the external contact parts 14.

The semiconductor package 80 includes a semiconductor chip 81 having electrode pads 83, the substrate 10 having the leads 12, the bumps 85 connected to the corresponding pads 83 and the end surface 19B of the corresponding through connections 19, and an underfill resin layer 84. The underfill resin layer 84 fills a gap between the semiconductor chip 81 and the substrate 10.

The substrate base 16 is not limited to a silicon substrate base, and may be formed by a circuit board having vias and wirings formed in a build-up substrate or a glass epoxy substrate.

Of course, the pitch at which the leads 12 are arranged in each of two mutually perpendicular directions (that is, horizontal and vertical directions) in FIG. 4 does not need to be the same, and further, the pitch at which the leads 12 are arranged does not need to be constant in each of the two mutually perpendicular directions.

Further, the present invention is not limited to these embodiments, but various variations and modifications may be made without departing from the scope of the present invention.

What is claimed is:

1. A substrate comprising:
a substrate base having a first surface and a second surface located opposite the first surface;
a plurality of first pads arranged in a pattern on the first surface; and
a plurality of leads respectively having a flexible part with a generally U-shape, a first end provided on the flexible part, electrically connected to a corresponding one of the plurality of first pads, and a second end provided on the flexible part, located a predetermined distance away from the first end relative to the first surface along a direction perpendicular to the first surface,
wherein the first and second ends are substantially aligned in the direction perpendicular to the first surface in a first state in which the second end is pushed towards the first end by a target object and the flexible part is deformed thereby in order to electrically connect the substrate to the target object via the second end of each of the plurality of leads,
wherein the flexible part, whose a first end part is electrically connected to the corresponding one of the plurality of first pads, is offset from the corresponding one of the plurality of first pads in a direction parallel to the first surface in the first state and in a second state in which the second end is not pushed towards the first end by the target object and the flexible part is not deformed,
wherein each of the plurality of leads includes a first support part obliquely extending towards the first surface from the first end part of the flexible part, and a first connection part extending from the first support part and connecting to the first end,
wherein the first support part forms an acute angle with respect to a plane that is parallel to the first surface and passes a surface of the first connection part opposing the first surface in the second state, in order to avoid contact between the first surface of the substrate base and the first support part in the first state in which the flexible part is deformed,
wherein each of the plurality of leads includes a second support part obliquely extending towards the target object from a second end part of the flexible part, opposite to the first end part of the flexible part, in the second state, and a second connection part extending from the second support part and connecting to the second end,
wherein the second connection part includes a projecting part obliquely extending towards the target object from the second support part in the second state, and a contact part having a rounded shape extending from the projecting part and reaching the second end,
wherein the projecting part has two ends thereof integrally formed on the second support part and the contact part, respectively, and
wherein the second support part projects towards the first end in the first state, in order to avoid contact between the target object and the second support part.

2. The substrate as claimed in claim 1, further comprising:
a plurality of second pads arranged in a pattern on the second surface.

3. The substrate as claimed in claim 2, further comprising:
a plurality of connections passing through the substrate base,
wherein each of the plurality of connections electrically connects one of the plurality of first pads to a corresponding one of the plurality of second pads.

4. The substrate as claimed in claim 1, wherein the first end electrically connects to the corresponding one of the plurality of first pads via a contact part made of a material selected from a group consisting of solder, conductor paste and conductive resin paste.

5. The substrate as claimed in claim 2, wherein the plurality of leads are electrically connected to the plurality of second pads.

6. The substrate as claimed in claim 1, wherein the acute angle is in a range of 5 degrees to 15 degrees.

7. The substrate as claimed in claim 1, further comprising:
a plurality of connections embedded in the substrate base,
wherein the plurality of connections include first end surfaces at the first surface provided with the plurality of first pads.

8. The substrate as claimed in claim 7, further comprising:
a plurality of second pads arranged in a pattern on the second surface, wherein the plurality of connections are provided within corresponding through holes that penetrate the substrate base from the first surface to the second surface, and wherein the plurality of connections further include second end surfaces at the second surface provided with the plurality of second pads.

9. An electronic component comprising:
the substrate as claimed in claim 1; and
a circuit board forming the target object.

10. An electronic component comprising:
the substrate as claimed in claim 1; and
a semiconductor package forming the target object.

11. An electronic component comprising:
the substrate as claimed in claim 2; and
a semiconductor chip having electrode pads electrically connected to the plurality of second pads.

12. The electronic component as claimed in claim 11, further comprising:
a circuit board forming the target object.

13. The substrate as claimed in claim 1, wherein the plurality of first pads are arranged on the first surface along a predetermined direction, and the flexible part of each of the plurality of leads extends with an inclination having a predetermined angle other than zero with respect to the predetermined direction in a plan view of the first surface viewed in the direction perpendicular to the first surface.

14. The substrate as claimed in claim 13, wherein the predetermined angle is in a range of 25 degrees to 35 degrees.

15. The substrate as claimed in claim 1, wherein each of the plurality of leads is formed from a conductor plate.

16. A substrate comprising:
a substrate base having a first surface and a second surface located opposite the first surface;
a plurality of first pads arranged in a pattern on the first surface;
a plurality of second pads arranged in a pattern on the second surface;
a plurality of connections embedded in the substrate base, each of the plurality of connections electrically connecting one of the plurality of first pads to a corresponding one of the plurality of second pads; and
a plurality of leads respectively having a flexible part with a generally U-shape, a first end provided on the flexible part, electrically connected to a corresponding one of the plurality of first pads, and a second end provided on the flexible part, located a predetermined distance away from the first end relative to the first surface along a direction perpendicular to the first surface, wherein the first and second ends are substantially aligned in the direction perpendicular to the first surface in a first state in which the second end is pushed towards the first end by a target object and the flexible part is deformed thereby in order to electrically connect the substrate to the target object via the second end of each of the plurality of leads, wherein the flexible part, whose a first end part is electrically connected to the corresponding one of the plurality of first pads, is offset from the corresponding one of the plurality of first pads in a direction parallel to the first surface in the first state and in a second state in which the second end is not pushed towards the first end by the target object and the flexible part is not deformed, wherein each of the plurality of leads includes a first support part obliquely extending towards the first surface from the first end part of the flexible part, and a first connection part extending from the first support part and connecting to the first end, wherein the first support part forms an acute angle with respect to a plane that is parallel to the first surface and passes a surface of the first connection part opposing the first surface in the second state, in order to avoid contact between the first surface of the substrate base and the first support part in the first state in which the flexible part is deformed, wherein each of the plurality of leads includes a second support part obliquely extending towards the target object from a second end part of the flexible part, opposite to the first end part of the flexible part, in the second state, and a second connection part extending from the second support part and connecting to the second end, wherein the second connection part includes a projecting part obliquely extending towards the target object from the second support part in the second state, and a contact part having a rounded shape extending from the projecting part and reaching the second end, wherein the projecting part has two ends thereof integrally formed on the second support part and the contact part, respectively, wherein the second support part projects towards the first end in the first state, in order to avoid contact between the target object and the second support part, wherein a first end surface of each of the plurality of connections exposed at the first surface matches the first surface, wherein a second end surface of the plurality of connections exposed at the second surface matches the second surface, wherein each of the plurality of first pads is provided on the first end surface of a corresponding one of the plurality of connections, and wherein each of the plurality of second pads is provided on the second end surface of a corresponding one of the plurality of connections.

17. The substrate as claimed in claim 16, wherein the plurality of first pads are arranged on the first surface along a predetermined direction, and the flexible part of each of the plurality of leads extends with an inclination having a predetermined angle other than zero with respect to the predetermined direction in a plan view of the first surface viewed in the direction perpendicular to the first surface.

18. The substrate as claimed in claim 17, wherein the predetermined angle is in a range of 25 degrees to 35 degrees.

19. The substrate as claimed in claim 16, wherein the acute angle is in a range of 5 degrees to 15 degrees.

20. The substrate as claimed in claim 17, wherein the acute angle is in a range of 5 degrees to 15 degrees.

* * * * *